(12) United States Patent
Goto

(10) Patent No.: US 11,516,605 B2
(45) Date of Patent: Nov. 29, 2022

(54) AUDIO DEVICE, SERVER, AUDIO SYSTEM, AND METHOD OF CONTROLLING AUDIO DEVICE

(71) Applicant: YAMAHA CORPORATION, Hamamatsu (JP)

(72) Inventor: Mitsutaka Goto, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 0 days.

(21) Appl. No.: 17/022,671

(22) Filed: Sep. 16, 2020

(65) Prior Publication Data

US 2020/0413208 A1 Dec. 31, 2020

Related U.S. Application Data

(63) Continuation of application No. PCT/JP2019/008992, filed on Mar. 7, 2019.

(30) Foreign Application Priority Data

Mar. 22, 2018 (JP) ................................ 2018-053821

(51) Int. Cl.
*H04R 29/00* (2006.01)
*H04R 3/00* (2006.01)
*H03F 1/52* (2006.01)

(52) U.S. Cl.
CPC ............. *H04R 29/001* (2013.01); *H03F 1/52* (2013.01); *H04R 3/007* (2013.01); *H04R 2430/20* (2013.01)

(58) Field of Classification Search
CPC .. H04R 29/001; H04R 3/007; H04R 2430/20; H03F 1/52

USPC ..... 381/58, 120, 59, 119, 121; 330/185, 192
See application file for complete search history.

(56) References Cited

U.S. PATENT DOCUMENTS

| | | | |
|---|---|---|---|
| 6,683,494 B2* | 1/2004 | Stanley | H03F 3/2175 330/10 |
| 2006/0147069 A1* | 7/2006 | Svajda | H04R 25/554 381/316 |
| 2009/0033412 A1 | 2/2009 | Suyama | |
| 2017/0030954 A1* | 2/2017 | Whatmough | G01R 23/04 |

(Continued)

FOREIGN PATENT DOCUMENTS

| | | |
|---|---|---|
| CN | 206061141 U | 3/2017 |
| CN | 107332630 A | 11/2017 |
| JP | H07111686 A | 4/1995 |

(Continued)

OTHER PUBLICATIONS

International Search Report issued in Inti. Appln. No PCT/JP2019/008992 dated Jun. 4, 2019. English translation provided.

(Continued)

*Primary Examiner* — Vivian C Chin
*Assistant Examiner* — Con P Tran
(74) *Attorney, Agent, or Firm* — Rossi, Kimms & McDowell LLP

(57) ABSTRACT

An audio device includes a network interface, an amplifier that amplifies an audio signal received through the network interface, and a processor configure to obtain an output value of a signal from the amplifier and sends the output value of the signal through the network interface.

9 Claims, 18 Drawing Sheets

(56) References Cited

U.S. PATENT DOCUMENTS

2018/0352329 A1\* 12/2018 Klingler ............... H04R 1/2811
2019/0028805 A1    1/2019 Goto

FOREIGN PATENT DOCUMENTS

| | | |
|---|---|---|
| JP | H11215683 A | 8/1999 |
| JP | 2006514808 A | 5/2006 |
| JP | 2009038561 A | 2/2009 |
| JP | 2010087938 A | 4/2010 |
| WO | 02078179 A2 | 10/2002 |
| WO | 2017164380 A1 | 9/2017 |

OTHER PUBLICATIONS

Office Action issued in Japanese Appln. No. 2018-053821 dated Oct. 5, 2021. English translation provided.
Office Action issued in Indian Appln. No. 202037041536 dated Sep. 21, 2021.
English translation of Written Opinion issued in Intl. Appln. No. PCT/JP2019/008992 dated Jun. 4, 2019.
Extended European search report issued in European Appln. No. 19770817.5 dated Nov. 18, 2021.

\* cited by examiner

AUDIO DEVICE, SERVER, AUDIO SYSTEM, AND METHOD OF CONTROLLING AUDIO DEVICE

CROSS REFERENCE TO RELATED APPLICATIONS

The present application is a continuation application of International Patent Application No. PCT/JP2019/008992, filed on Mar. 7, 2019, which claims priority to Japanese Patent Application No. 2018-053821, filed on Mar. 22, 2018. The contents of these applications are incorporated herein by reference in their entirety.

TECHNICAL FIELD

A preferred embodiment of the present invention relates to an audio device that inputs or outputs an audio signal, a server, an audio system, and a method of controlling such an audio device.

BACKGROUND ART

Patent Literature 1 discloses that a signal of a DSP (Digital Signal Processor) 6 is outputted to an emulator 10 to cause the emulator 10 to perform debug of the DSP 6.

CITATION LIST

Patent Literature

Patent Literature 1: Japanese Examined Patent Application Publication No. H07-111686

SUMMARY OF THE INVENTION

Technical Problem

It is important that an audio device does not stop a sound while in use. In other words, it is important that an audio device predicts whether or not such a problem that a sound stops occurs. Patent Literature 1 does not disclose that occurrence of a problem is predicted.

A preferred embodiment of the present invention is directed to provide an audio device, a server, and an audio system, a method of controlling an audio device that are able to check information to predict a problem of the audio device, from outside of the audio device.

Solution to Problem

An audio device includes a network interface, an amplifier that amplifies an audio signal received through the network interface, and a processor configured to obtain an output value of a signal from the amplifier and sends the output value of the signal through the network interface.

Advantageous Effects of Invention

A preferred embodiment of the present invention is able to check information to predict a problem of an audio device from outside of the audio device.

DETAILED DESCRIPTION OF PREFERRED EMBODIMENTS

Figure 1:
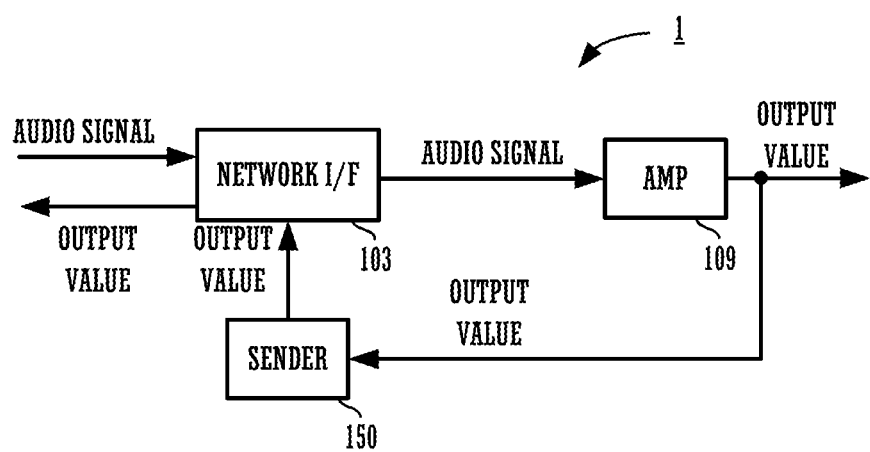
FIG. 1 is a block diagram showing a configuration of an audio device 1.
Figure 2:
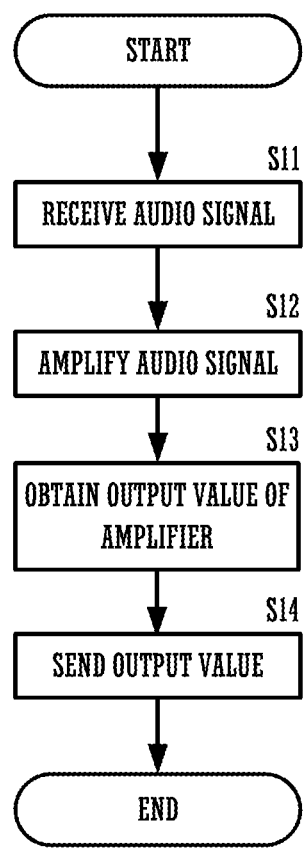
FIG. 2 is a flow chart showing an operation of the audio device 1.
Figure 3:
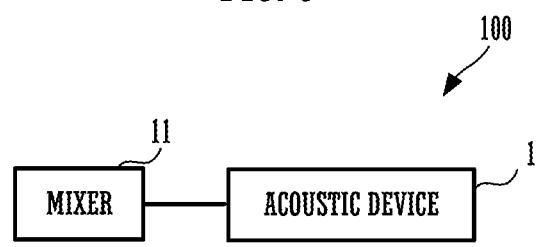
FIG. 3 is a block diagram showing a configuration of an audio system 100 including the audio device 1 and a mixer 11 connected to the audio device 1.
Figure 4:
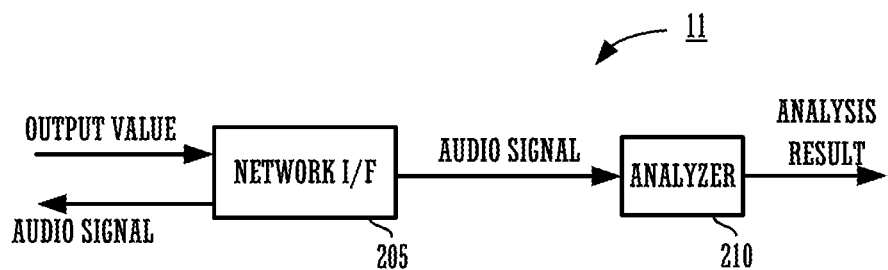
FIG. 4 is a block diagram showing a configuration of the mixer 11.
Figure 5:
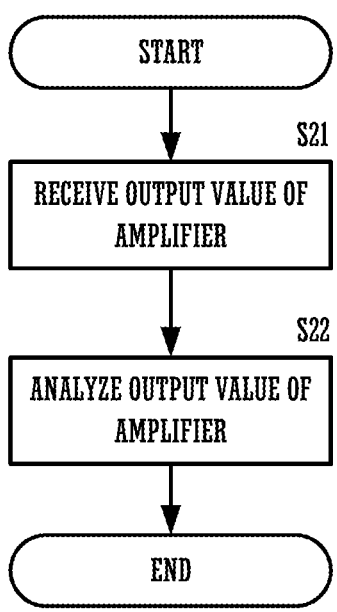
FIG. 5 is a flow chart showing an operation of the mixer 11.

FIG. 1 is a block diagram showing a configuration of an audio device 1 according to a preferred embodiment of the present invention. FIG. 2 is a flow chart showing an operation of the audio device 1. FIG. 3 is a block diagram showing a configuration of an audio system 100 including the audio device 1 and a mixer 11 connected to the audio device 1. FIG. 4 is a block diagram showing a configuration of a mixer 11. FIG. 5 is a flow chart showing an operation of the mixer 11.

The audio device 1 includes a network interface (I/F) 103, an amplifier 109, and a sender 150. The network I/F 103 receives an audio signal from an external device (a mixer 11, for example) through a network (S11). The network I/F 103 inputs the received audio signal to the amplifier 109. It is to be noted that, although omitted in FIG. 1, the audio device 1 includes a D/A converting device that converts a digital audio signal into an analog audio signal.

It is to be noted that the audio device 1 may include a signal processor (DSP: Digital Signal Processor) that processes the audio signal that the network I/F 103 has received.

The amplifier 109 amplifies and outputs the inputted analog audio signal (S12). The analog audio signal is inputted to a not-shown speaker, and is outputted as a sound.

The sender 150 obtains an output value of the amplifier 109 (S13). The sender 150, for example, obtains a current value or a voltage value as an example of the output value of the amplifier 109 through a current sensor or a voltage sensor provided in the amplifier 109.

The sender 150 sends the obtained output value of the amplifier 109 through the network I/F 103 (S14). For example, the sender 150 sends the output value to the mixer 11 connected through the network.

The mixer 11, as shown in FIG. 4, includes a network I/F 205 and an analyzer 210. The network I/F 205 receives the output value (S21). In other words, the network I/F 205 corresponds to a receiver. The analyzer 210 analyzes the received output value (S22). The mixer 11 predicts whether or not there is a possibility that a problem may occur in the audio device 1, based on an analysis result of the analyzer 210. For example, in a case in which a voltage value shows an unusually high value or a current value shows an unusually high value, there is a possibility that such a problem that a sound stops in the audio device 1 may occur.

In this manner, a preferred embodiment of the present invention makes it possible to check information to predict a problem of the audio device 1 from outside (the mixer 11, for example) of the audio device 1.

Figure 6:
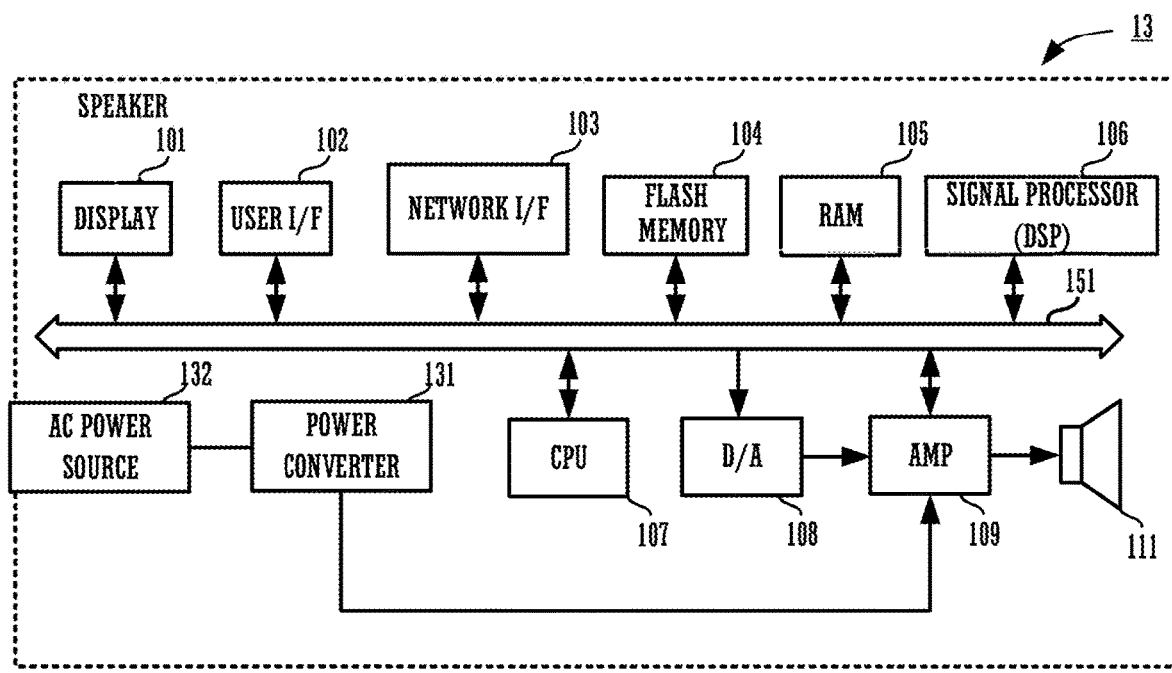
FIG. 6 is a block diagram showing a configuration of a speaker 13.

Next, FIG. 6 is a block diagram showing a configuration of a speaker 13. The speaker 13 is one of the specific examples of the audio device 1.

The speaker 13 includes a display 101, a user interface (I/F) 102, a network interface (I/F) 103, a flash memory 104, a RAM 105, a signal processor 106, a CPU 107, a D/A converter 108, an amplifier 109, a speaker unit 111, a power converter 131, and an AC power supply 132.

The display 101, user I/F 102, the network I/F 103, the flash memory 104, the RAM 105, the signal processor 106, the CPU 107, the D/A converter 108, and the amplifier 109 are connected to a bus 151. The speaker unit 111 is connected to the amplifier 109.

The power converter 131 supplies electric power (direct-current power) to drive the amplifier 109. It is to be noted that the power converter 131 may supply power to each component of the speaker 13. For example, the power converter 131 may supply power to the CPU 107 to drive. The power converter 131 converts to direct-current power from alternating-current power which is from the AC power supply 132.

The AC power supply 132 is a power supply that supplies alternating-current power to the power converter 131. The AC power supply 132 is connected to an AC power source for equipment, a power source car, or the like. The AC power supply 132 receives alternating-current power from the AC power source for equipment, a power source car (including a car can be used as a power source, such as), or the like, and supplies the alternating-current power to the power converter 131.

The display 101 includes an LCD (a Liquid Crystal Display) or an OLED (an Organic Light-Emitting Diode), for example, and displays various types of information. The user I/F 102 includes a switch, a knob, or a touch panel, and receives an operation of a user. In a case in which the user I/F 102 is a touch panel, the user I/F 102 configures a GUI (used below as an abbreviation for Graphical User Interface) together with the display 101.

The CPU 107 reads a program stored in the flash memory 104 being a storage medium to the RAM 105, and implements a predetermined function. For example, the CPU 107 displays an image for receiving an operation from the user on the display 101, and, by receiving an operation such as a selection operation of the image from the user I/F 102, implements a GUI.

It is to be noted that the program that the CPU 107 reads does not need to be stored in the flash memory 104 in the own device. For example, the program may be stored in a storage medium of an external device such as a server. In such a case, the CPU 107 may read the program each time from the server to the RAM 105 and execute the program.

The network I/F 103 receives an audio signal from an external device (the mixer 11, for example) through the network (the same operation as S11 in FIG. 2).

The signal processor 106 is composed of a DSP for performing various types of signal processing. The signal processor 106 performs signal processing such as mixing, equalizing, or compressing, on the audio signal inputted through the network I/F 103. The signal processor 106 outputs the audio signal on which the signal processing has been performed, to the D/A converter 108.

The D/A converter 108 converts the inputted audio signal into an analog audio signal. The amplifier 109 amplifies and outputs the analog audio signal (the same operation as S12 in FIG. 2). The analog audio signal is inputted to a speaker unit 111, and is outputted as a sound.

Figure 7:
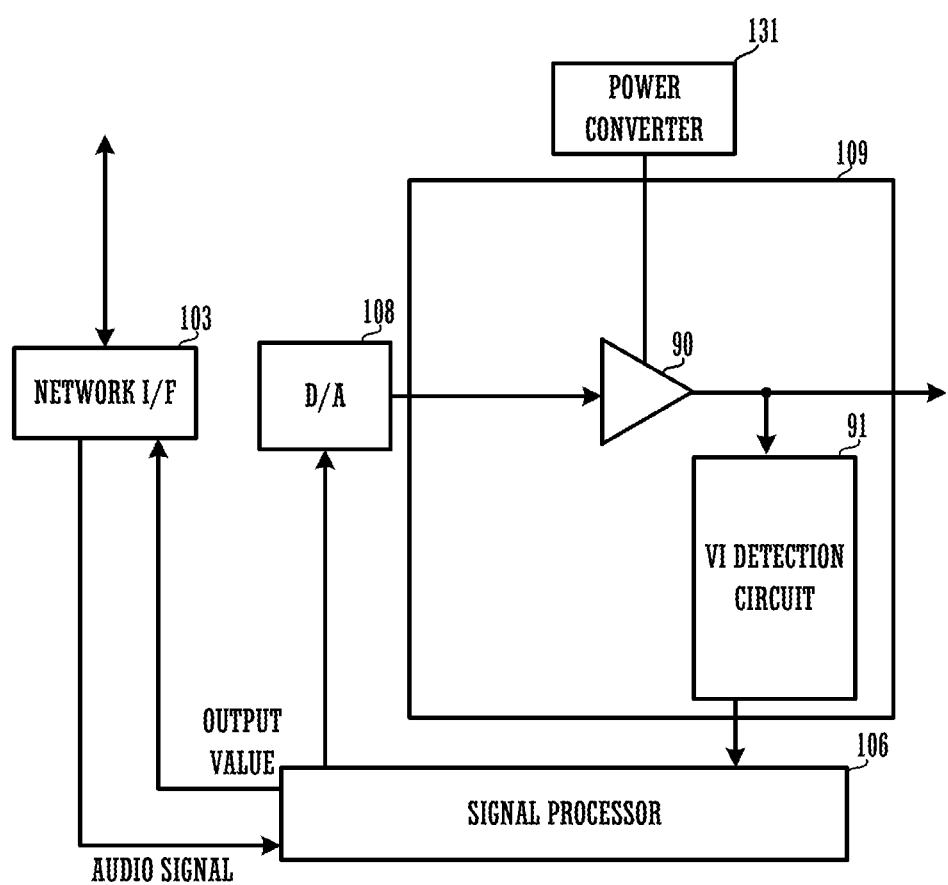
FIG. 7 is a block diagram showing a more detailed configuration of an amplifier 109.

FIG. 7 is a block diagram showing a more detailed configuration of the amplifier 109. The amplifier 109 includes an amplifying element 90 and a current-voltage (VI) detection circuit 91. The amplifying element 90 is connected to the power converter 131. The amplifying element 90, by receiving power supply from the power converter 131, amplifies the analog audio signal outputted from the D/A converter 108, and outputs the amplified audio signal.

The VI detection circuit 91 is connected to the subsequent stage of the amplifying element 90, and detects a current value and a voltage value as an example of an output value of the amplifying element 90. The signal processor 106 obtains a current value and a voltage value from the VI detection circuit 91 (the same operation as S13 in FIG. 2). The signal processor 106 sends the obtained output value through the network I/F 103 (the same operation as S14 in FIG. 2). In other words, in this example, the signal processor 106 configures the sender 150 shown in FIG. 1 by obtaining the output value of the amplifier 109 and sending the output value through the network I/F 103.

In this example, The sender 150 is configured with the DSP that receives an audio signal through the network I/F 103 and processes the received audio signal. Therefore, the audio device 1 does not need to separately include new hardware to send the output value of the amplifier 109. In addition, the sender 150 may be configured by an operation of software that the CPU 107 reads. In this case as well, the audio device 1, without having to separately include new hardware to send an output value, is able to send the output value of the amplifier 109.

Figure 8:
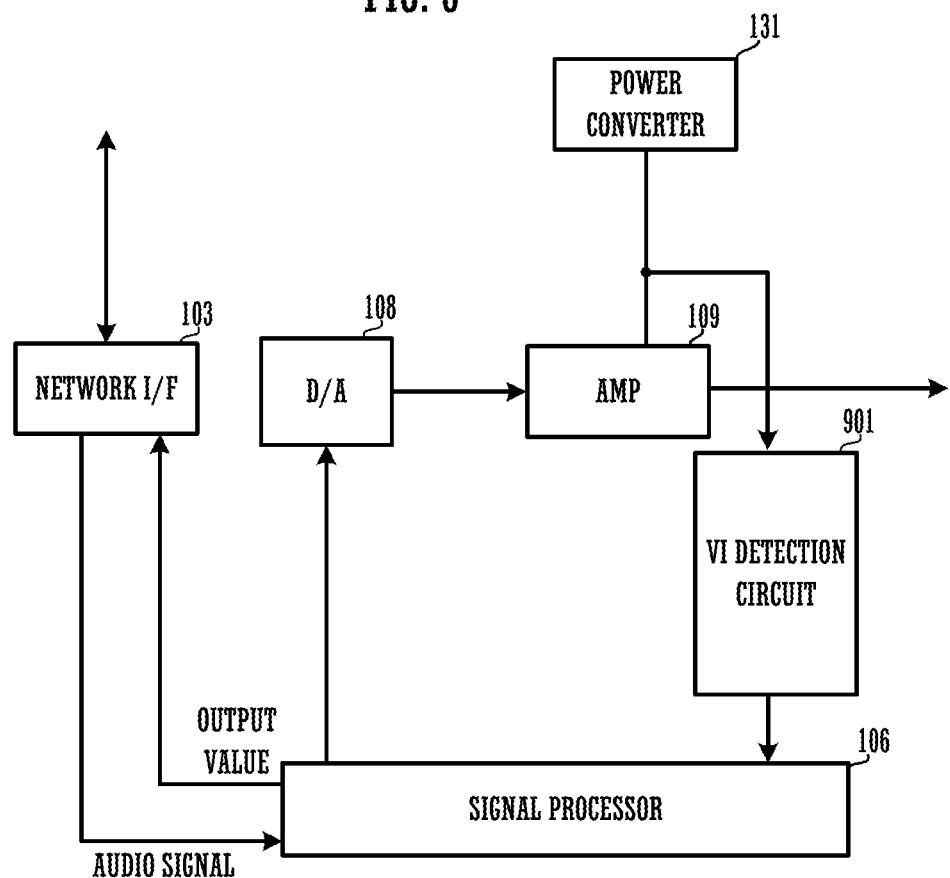
FIG. 8 is a block diagram showing a detailed configuration of a speaker 13 according to a first modification.

FIG. 8 is a block diagram showing a detailed configuration of a speaker 13 according to a first modification. The speaker 13 according to the first modification includes a VI detection circuit 901 in place of the VI detection circuit 91. Other configurations are the same as the configurations of the block diagram shown in FIG. 7.

The VI detection circuit 901 is connected a connection node which is between the power converter 131 and the amplifier 109. The VI detection circuit 901 detects a value (a current value and a voltage value) of direct-current power that the power converter 131 supplies to the amplifier 109. The signal processor 106 obtains the current value and voltage value of the power converter 131 from the VI detection circuit 901. The signal processor 106 sends the obtained current value and voltage value of the power converter 131, through the network I/F 103. In other words, in this example, the signal processor 106 obtains the current value and voltage value from the power converter 131, and sends through the network I/F 103.

As a result, the analyzer 210 is able to predict whether or not there is a possibility that a problem resulting from the direct-current power that the power converter 131 supplies may occur. For example, when a problem occurs in various types of components of the power converter 131, a voltage value may decrease or a current value may decrease. Accordingly, in a case in which a voltage value of the power converter 131 is an unusually low value or a current value is an unusually low value, there is a possibility that such a problem that makes a sound to stop in the audio device 1 may occur.

Accordingly, the first modification checks a state of the direct-current power of the power converter 131 from the outside (the mixer 11, for example) of the audio device 1, as information to predict a problem of the audio device 1.

Figure 9:
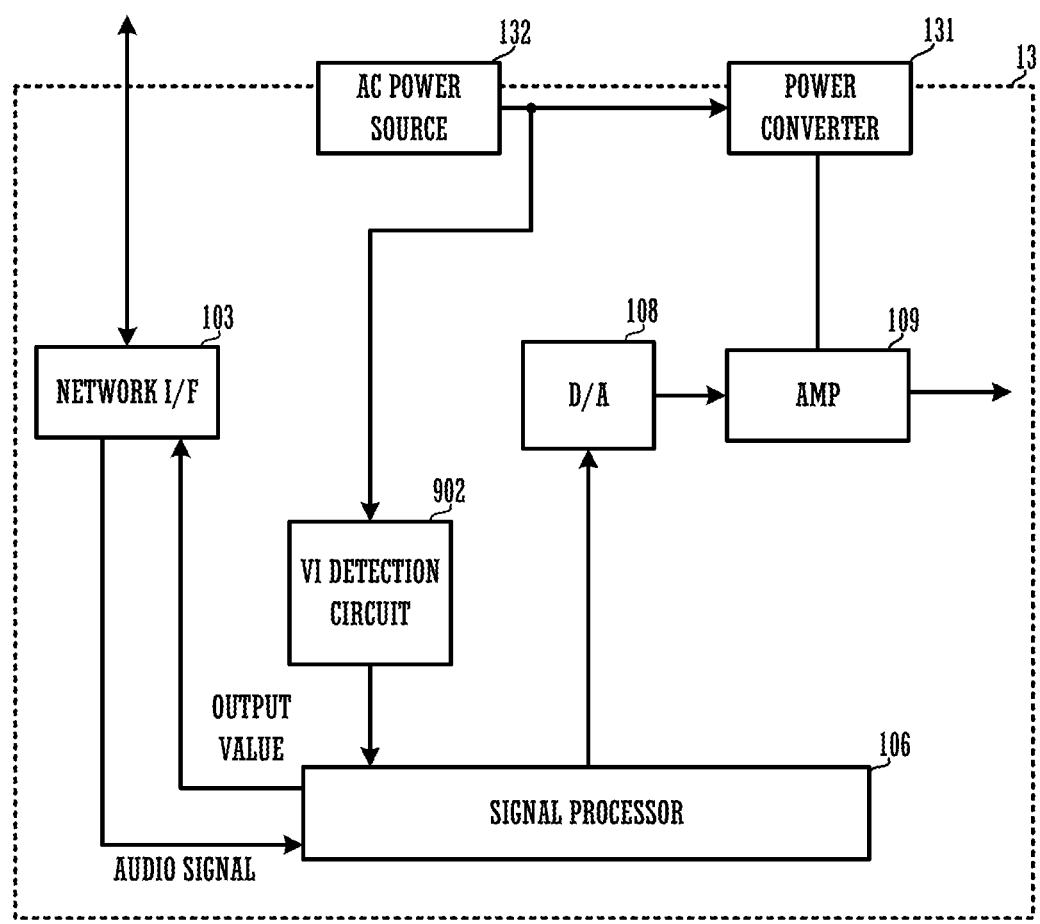
FIG. 9 is a block diagram showing a detailed configuration of a speaker 13 according to a second modification.

FIG. 9 is a block diagram showing a detailed configuration of the speaker 13 according to the second modification. The speaker 13 according to the second modification includes a VI detection circuit 902.

The VI detection circuit 902 is connected to a connection node which is between the AC power supply 132 and the power converter 131. The VI detection circuit 902 detects a value (a current value and a voltage value) of alternating-current power that the AC power supply 132 supplies to the power converter 131. The signal processor 106 obtains the detected current value and the detected voltage value of the AC power supply 132 from the VI detection circuit 902. The signal processor 106 sends the obtained current value and voltage value of the AC power supply 132, through the network I/F 103. In other words, in this example, the signal processor 106 obtains the current value and voltage value of the alternating-current power that the AC power supply 132 outputs, and sends through the network I/F 103.

As a result, the analyzer 210 is able to predict whether or not there is a possibility that a problem resulting from the alternating-current power of the AC power supply 132 may occur. For example, in a case in which voltage of a power source on an equipment side unusually decreases, there is a possibility that such a problem that makes a sound to stop in the audio device 1 may occur.

Accordingly, the second modification checks a state of the alternating-current power of the AC power supply 132 from the outside (the mixer 11, for example) of the audio device 1, as information to predict a problem of the audio device 1.

It is to be noted that, although the configuration shown in each of FIG. 7, FIG. 8, and FIG. 9 is able to be implemented independently, the configuration shown in FIG. 7, FIG. 8, and FIG. 9 is also able to be combined.

Figure 10:
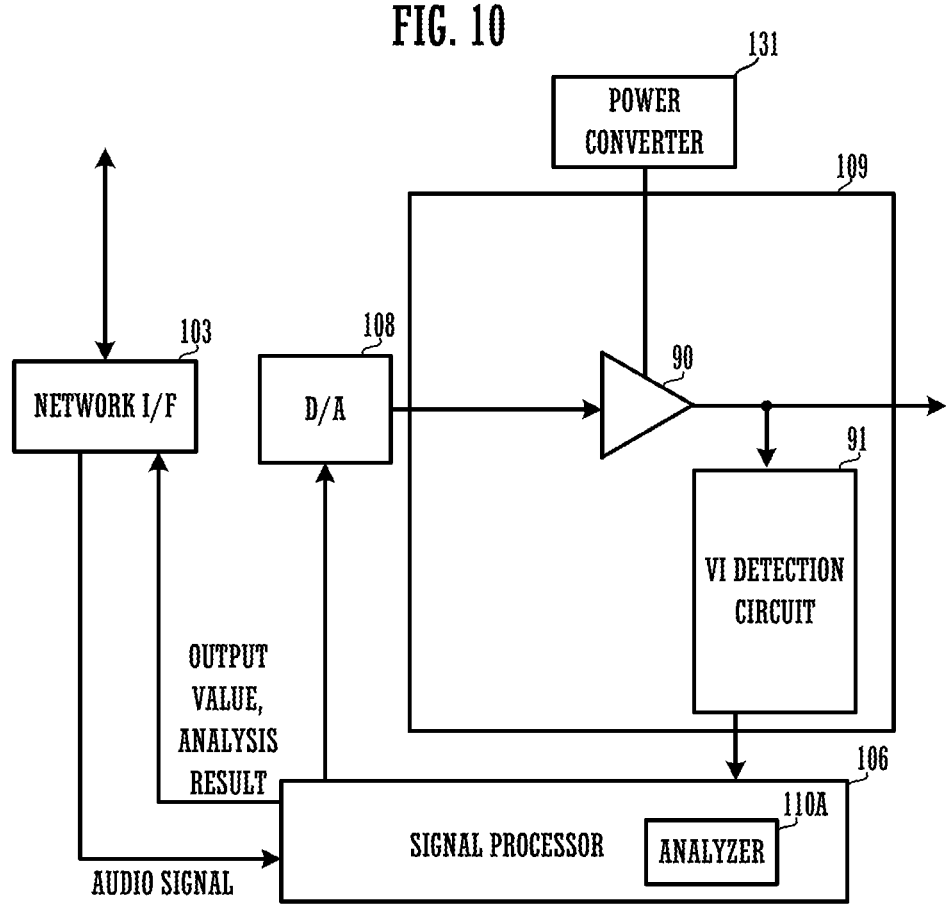
FIG. 10 is a block diagram showing a detailed configuration of an amplifier 109 according to a third modification.

Next, FIG. 10 is a block diagram showing a detailed configuration of an amplifier 109 according to a third modification. In the amplifier 109 according to the third modification, the signal processor 106 includes an analyzer 110A. Other configurations are the same as the configurations of the block diagram shown in FIG. 7.

It is to be noted that, although the signal processor 106 implements the function of the analyzer 110A in the example of FIG. 10, different hardware may configure the analyzer 110A. In addition, the CPU 107 may implement the function of the analyzer 110A by software.

The analyzer 110A analyzes the current value and voltage value of the amplifier 109 that have been detected in the VI detection circuit 91. The analyzer 110A, for example, calculates frequency characteristics of impedance as an example of analysis. The analyzer 110A converts a signal with a time axis of the impedance calculated from the current value and the voltage value into a signal with a frequency axis by the FFT (fast Fourier transform: Fast Fourier Transform). The analyzer 110A outputs the frequency characteristics of the impedance. An analysis result, as shown in FIG. 10, is outputted to an external device through the network I/F 103 or is displayed on the display 101 by the CPU 107.

Figure 11:
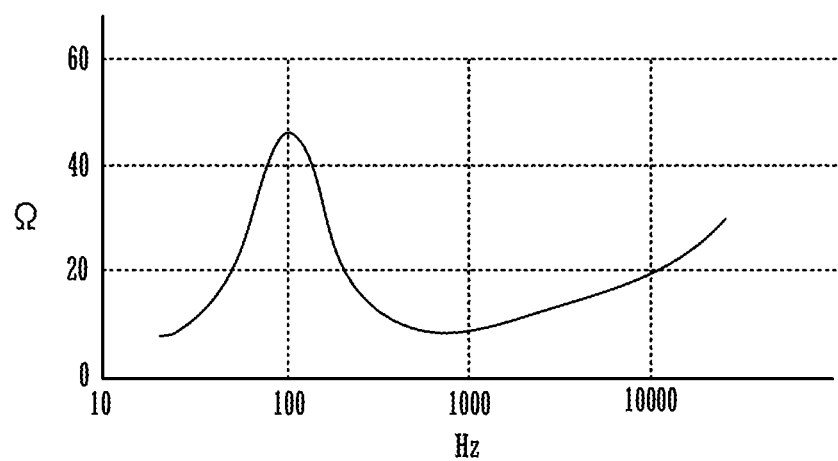
FIG. 11 is a diagram showing frequency characteristics of impedance.

FIG. 11 is a diagram showing the frequency characteristics of impedance. The horizontal axis of a graph indicates frequency (Hz) and the vertical axis indicates impedance (Ω). In general amplifiers including the amplifier 109, a resonance point occurs in the impedance due to the electric characteristics of each component, the mechanical characteristics of components (a speaker cone and an enclosure, for example) of a speaker unit, or the like. In the example of FIG. 10, a resonance point is present near 100 Hz.

Figure 12:
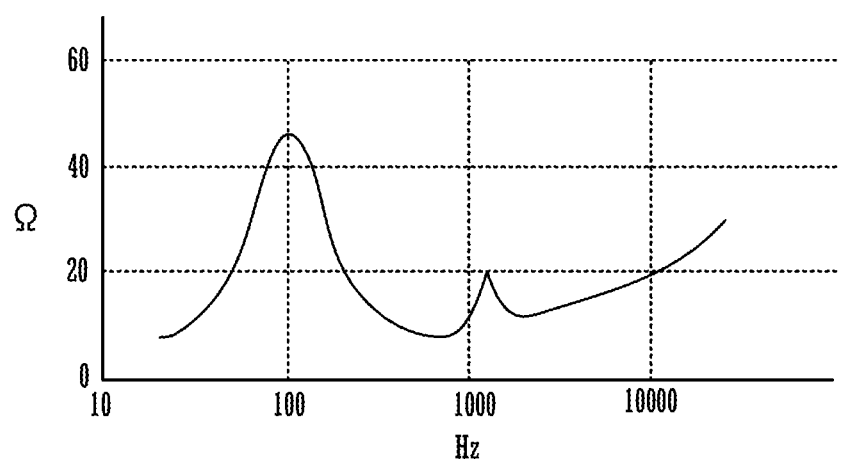
FIG. 12 is a diagram showing frequency characteristics of impedance.

Then, when a problem occurs in the speaker unit 111, there is a possibility that the impedance of the amplifier 109 may change rapidly in a short time. For example, as shown in FIG. 12, when a frequency (a singular point) with unusually high impedance is shown, a current does not flow and the amplifier 109 is brought into a state of being unable to damp a speaker. In addition, when a frequency (a singular point) with unusually low impedance is shown, a speaker cone instantly reaches the maximum amplitude, which brings the speaker cone into a state of being unable to vibrate. When such states continue, there is a possibility that a problem may occur in the amplifier 109 or the speaker unit 111, and thus a sound may stop.

Therefore, the audio device 1 calculates the frequency characteristics of impedance, and outputs (or displays in the display 101) the calculated frequency characteristics to the outside as an analysis result. As a result, a user can predict in advance whether or not such a problem that makes a sound to stop occurs by looking at the frequency characteristics of impedance. Alternatively, the CPU 107, in a case in which the above singular point occurs, performs alarm display in the display 101, or the like, so that the user can predict in advance whether or not a problem of a possibility that a sound may stop occurs.

Figure 13:
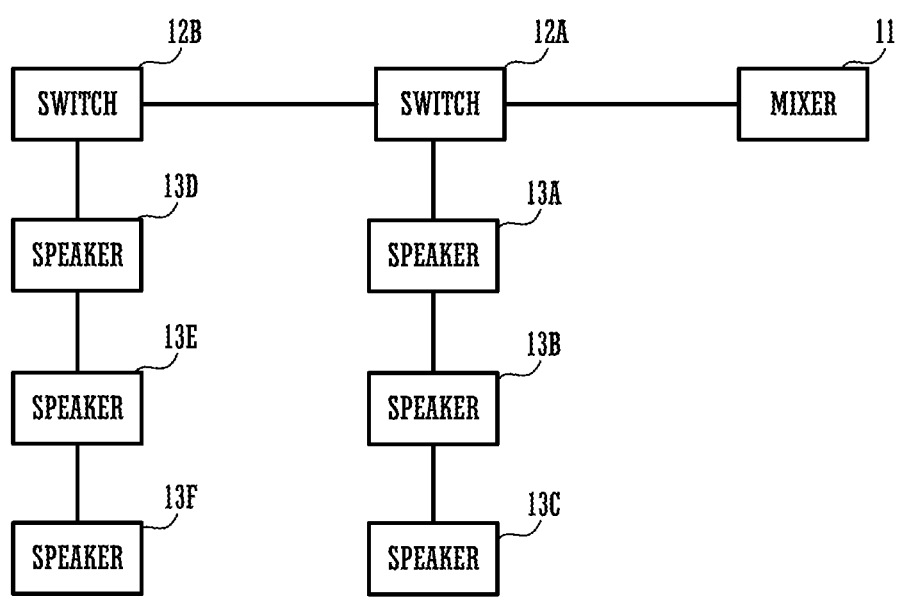
FIG. 13 is a block diagram showing a configuration of an audio system.

Next, FIG. 13 is a block diagram showing a configuration of an audio system 100A. The audio system 100A includes a mixer 11, a plurality of switches (a switch 12A, a switch 12B), and a plurality of speakers (a speaker 13A to a speaker 13F).

Each device is connected through a network cable. For example, the mixer 11 is connected to the switch 12A. The switch 12A is connected to the switch 12B and the speaker 13A. The switch 12B is connected to the switch 12A and the speaker 13D. The speaker 13A, the speaker 13B, and the speaker 13C are connected to the switch 12A in a daisy chain. In addition, the speaker 13D, the speaker 13E, and the speaker 13F are also connected to the switch 12B in a daisy chain. However, the connection between devices is not limited to the preferred embodiment shown in FIG. 13. In addition, each device does not need to be connected in a network, and may be connected with a communication line such as a USB cable, an HDMI (registered trademark), or a MIDI, for example, or may be connected with a digital audio cable.

The mixer 11 is an example of a server. The mixer receives an input of an audio signal from other devices connected in the network, or outputs an audio signal to other devices. The speaker 13A to the speaker 13F are examples of an audio device, and have the same configuration and function as the speaker 13. It is to be noted that the server is not limited to the mixer 11. For example, an information processing device such as a personal computer is also an example of the server. In addition, a system (DAW: Digital Audio Workstation) including hardware or software to perform work including recording, editing, mixing, or the like of audio is also an example of the server.

Figure 14:
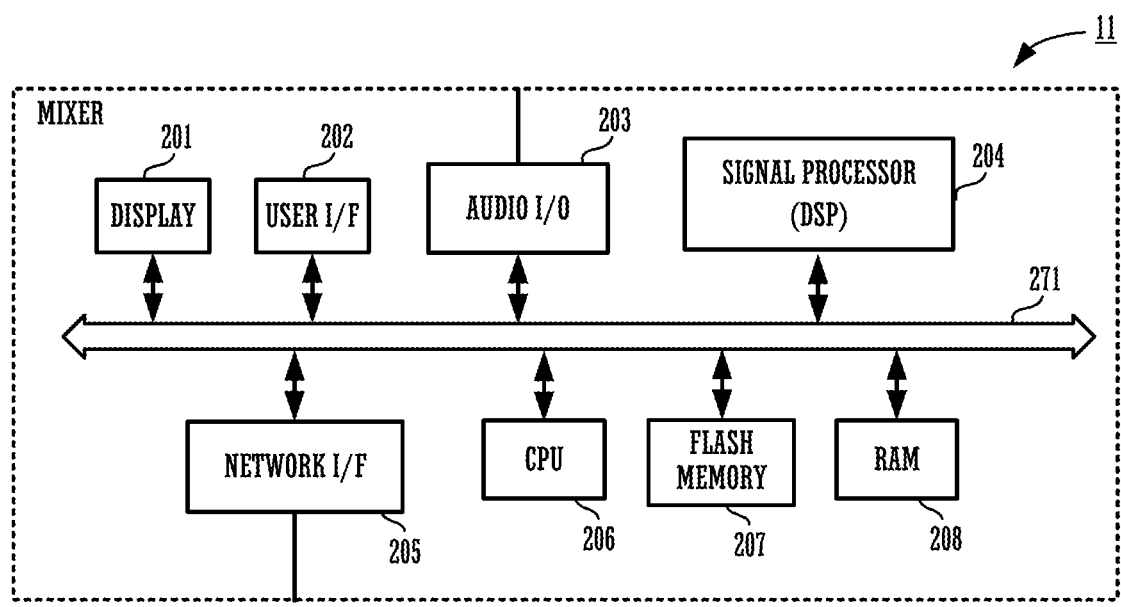
FIG. 14 is a block diagram showing a configuration of the mixer 11.

FIG. 14 is a block diagram showing a configuration of the mixer 11. The mixer 11 includes a display 201, a user I/F 202, an audio I/O (Input/Output) 203, a signal processor (DSP) 204, a network I/F 205, a CPU 206, a flash memory 207, and a RAM 208. Such components are connected through a bus 271.

The CPU 206 is a controller that controls an operation of the mixer 11. The CPU 206 performs various types of operations by reading a predetermined program stored in the flash memory 207 being a storage medium to the RAM 208 and executing the program. For example, the CPU 206 receives a current value and voltage value of each amplifier from the speaker 13A to the speaker 13F through the network I/F 205.

It is to be noted that the program that the CPU 206 reads does not also need to be stored in the flash memory 207 in the own device. For example, the program may be stored in a storage medium of an external device such as a server. In such a case, the CPU 206 may read the program each time from the server to the RAM 208 and execute the program.

The signal processor 204 is composed of a DSP configured to perform various types of signal processing. The signal processor 204 performs signal processing such as mixing, equalizing, or compressing, on an audio signal inputted through the audio I/O 203 or the network I/F 205. The signal processor 204 outputs the audio signal on which the signal processing has been performed, to another device such as the speaker 13A, through the audio I/O 203 or the network I/F 205.

In addition, the signal processor 204 receives an input of the current value and voltage value of each amplifier from the CPU 206. The signal processor 204 configures an analyzer 210. The analyzer 210 of the signal processor 204 analyzes an output value of each amplifier (the current value and voltage value of the amplifier 109) from the speaker 13A to the speaker 13F. The analyzer 210 of the signal processor 204 also calculates the frequency characteristics of impedance, for example. However, the signal processor 204 has a higher performance than the signal processor 106 of the speaker 13A to the speaker 13F, and has a high analysis function. Therefore, the signal processor 204 is able to calculate the frequency characteristics of impedance with higher resolution than the signal processor 106 of the speaker 13A to the speaker 13F. As a result, the signal processor 204 is able to obtain a singular point that may lead to a problem, with high accuracy.

Figure 15:
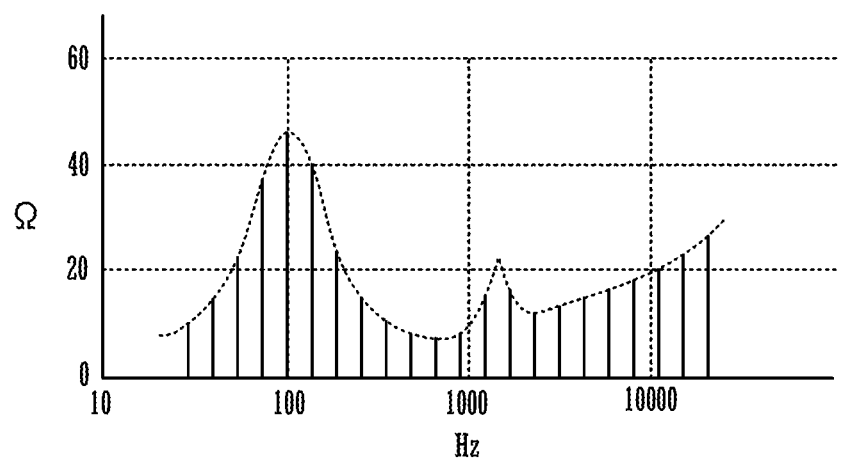
FIG. 15 is a diagram showing frequency characteristics of impedance calculated by a signal processor 106.
Figure 16:
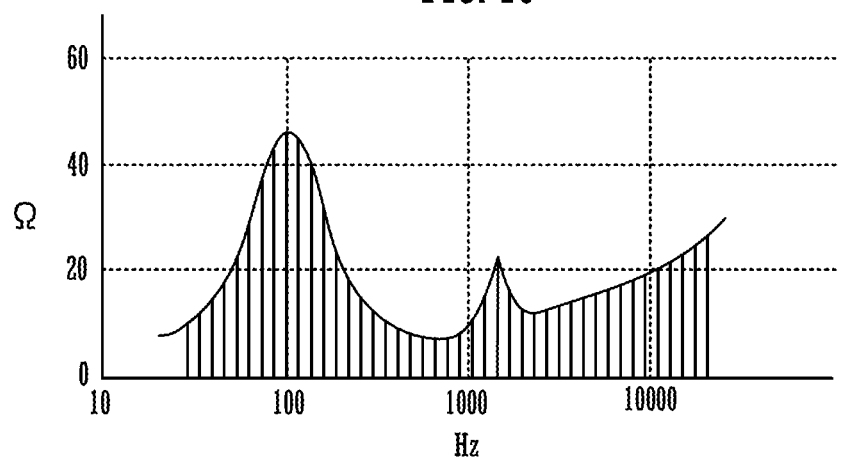
FIG. 16 is a diagram showing frequency characteristics of impedance calculated by a signal processor 204.

FIG. 15 is a diagram showing the frequency characteristics of impedance calculated by the signal processor 106, and FIG. 16 is a diagram showing the frequency characteristics of impedance calculated by the signal processor 204.

As shown in FIG. 15 and FIG. 16, the frequency characteristics of the impedance that the signal processor 106 and the signal processor 204 calculate are digital signals, and thus are discrete values. The number of the discrete value, that is, resolution depends on the number of taps of a digital filter implemented by the DSP, in other words, depends on a DSP resource. The signal processor 204 of the mixer 11 is implemented from high-performance and multiple DSPs in order to process audio signals of multiple channels. On the one hand, the signal processor 106 provided in the speaker 13, in order to process an audio signal for one channel or several channels sent from the mixer 11, uses a DSP of which the performance is relatively lower than the performance of the DSP of the signal processor 204 of the mixer 11. Therefore, as shown in FIG. 15 and FIG. 16, the resolution of the frequency characteristics of the impedance that the signal processor 106 calculates becomes lower than the resolution of the frequency characteristics of the impedance that the signal processor 204 of the mixer 11 calculates. Therefore, there is a possibility that, in the frequency characteristics of the impedance that the signal processor 106 has calculated, a resonant frequency that has a steep peak characteristic (a high Q value) may be unable to be extracted. On the other hand, as shown in FIG. 16, the frequency characteristics of the impedance that the signal processor 204 has calculated have high resolution, so that a resonant frequency that has a steep peak characteristic is also able to be extracted accurately.

In this manner, the mixer 11 is able to receive an output value of an amplifier from each speaker and conduct highly accurate analysis to the extent that is unable to be calculated in each speaker. In particular, in a case in which impedance changes rapidly in a short time, there is a possibility that a steep characteristic to the extent that is unable to be extracted in each speaker alone may occur. However, the mixer 11 conducts highly accurate analysis, so that a user can predict in advance a possibility that a problem may occur.

Figure 17:
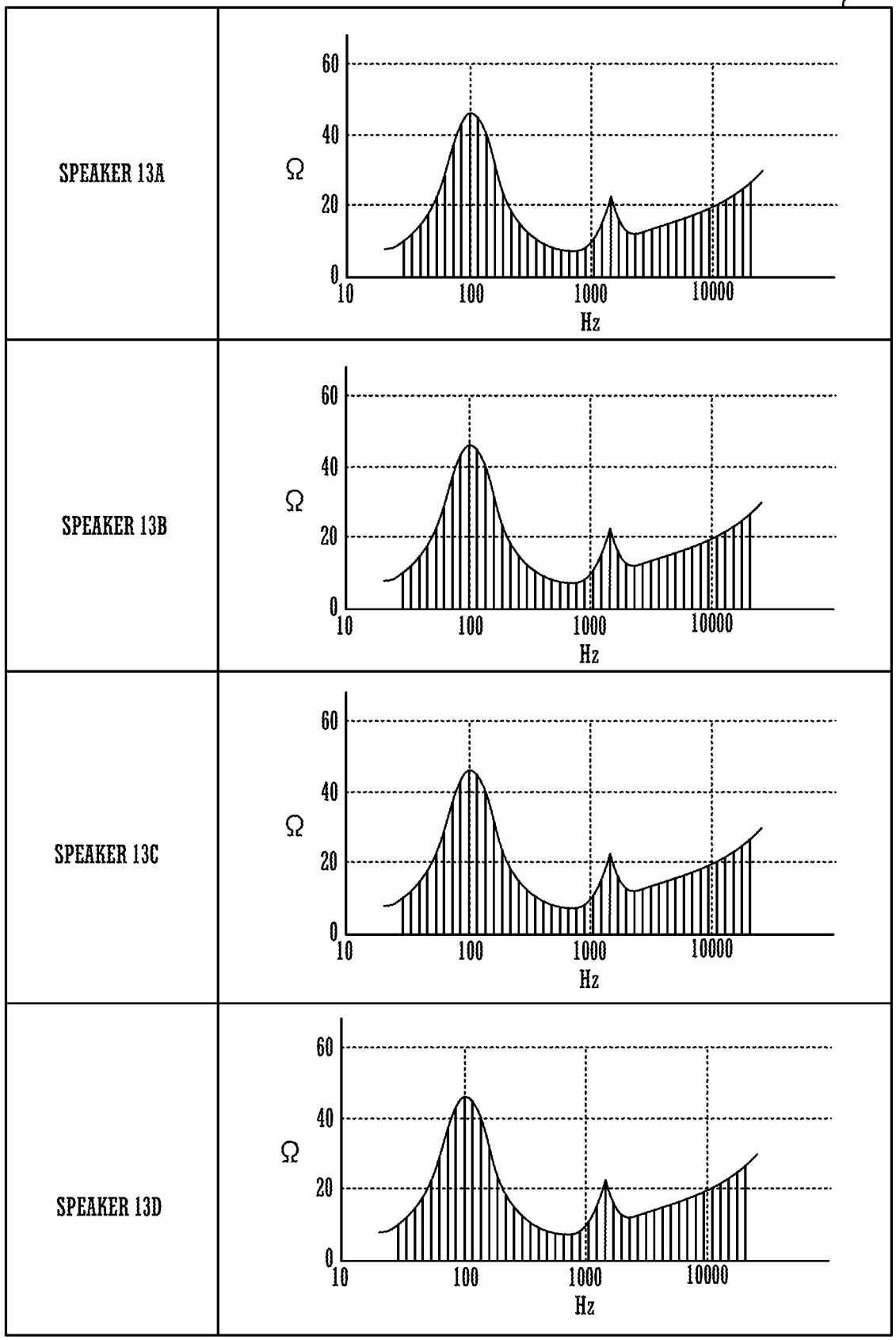
FIG. 17 is a diagram showing a display example in a display 201 of the mixer 11.

In addition, in the mixer 11, the user can list analysis results of a plurality of speakers. For example, the mixer 11, as shown in FIG. 17, displays the frequency characteristics of the impedance of the plurality of speakers of the speaker 13A, the speaker 13B, the speaker 13C, and the speaker 13D in the display 201 of the mixer 11.

In such a case, the user can easily specify a speaker that may cause a problem, among the plurality of installed speakers. Therefore, even when the number of installed speakers is increased, the user can easily reset which audio signal to be sent to which speaker and what type of signal processing to be performed. For example, the user, when determining that a possibility that a problem may occur in a certain speaker (a first speaker) is high, changes the setting of the mixer 11. For example, the user, by using the bus set to the first speaker for a different speaker (a second speaker), can cause an audio signal of the bus to be outputted from the second speaker.

In addition, the user looks at the display of the display 201 and can determine whether a possibility that a problem may occur only in a specific speaker is high or whether a possibility that a problem may occur in a plurality of speakers in conjunction with one another is high. For example, as shown in FIG. 17, in a case in which a similar singular point is generated in the plurality of speakers of the speaker 13A, the speaker 13B, the speaker 13C, and the speaker 13D, the user of the mixer 11 can determine that the problem is not an individual problem that occurs in each speaker but is a problem that occurs in a plurality of devices in conjunction with one another. Therefore, a cause common to a plurality of devices, such as a problem due to the power source on the equipment side, a problem of the space in which the speaker is installed, or a problem of equipment (a rack for installing in the form of an array, for example) to install a plurality of speakers, is able to be narrowed down.

In addition, as described above, the user of the mixer 11, in a case of determining that a possibility that a problem may occur in a specific speaker is high, can operate appropriate performance (operation) such as performing settings to send an audio signal to be sent to the specific speaker to a different speaker. In addition, the CPU 206 of the mixer 11, in a case in which an impedance characteristic (a peak with a high Q value) that shows a steeply high value is present in a predetermined frequency band, may perform an operation to send an audio signal to be sent to the speaker, to a different speaker. In such a case, the CPU 206 functions as a controller that controls a parameter of the audio device, based on an analysis result of the analyzer.

It is to be noted that, although the present preferred embodiment describes an example of calculating frequency characteristics of impedance, analysis is not limited to calculation of the frequency characteristics of impedance. For example, an average current value and an average voltage value may be obtained, or an instantaneous value and an average value may be compared. The output value of the amplifier 109 is an alternating-current signal, so that any method is able to be applied to a method to be used for analysis of an alternating-current signal.

In addition, the output value (a voltage value and a current value) of the amplifier is an analog audio signal itself, so that analysis as a sound is possible. The user can determine that a possibility that a problem may occur is high, for example, when a noise sound is loud, by listening to the output value (a voltage value and a current value) of the amplifier as a sound.

It is to be noted that the descriptions of the preferred embodiments are illustrative in all points and should not be construed to limit the present invention. The scope of the present invention is defined not by the foregoing preferred embodiments but by the claims for patent. Further, the scope of the present invention is intended to include all modifications within the scopes of the claims for patent and within the meanings and scopes of equivalents.

Figure 18:
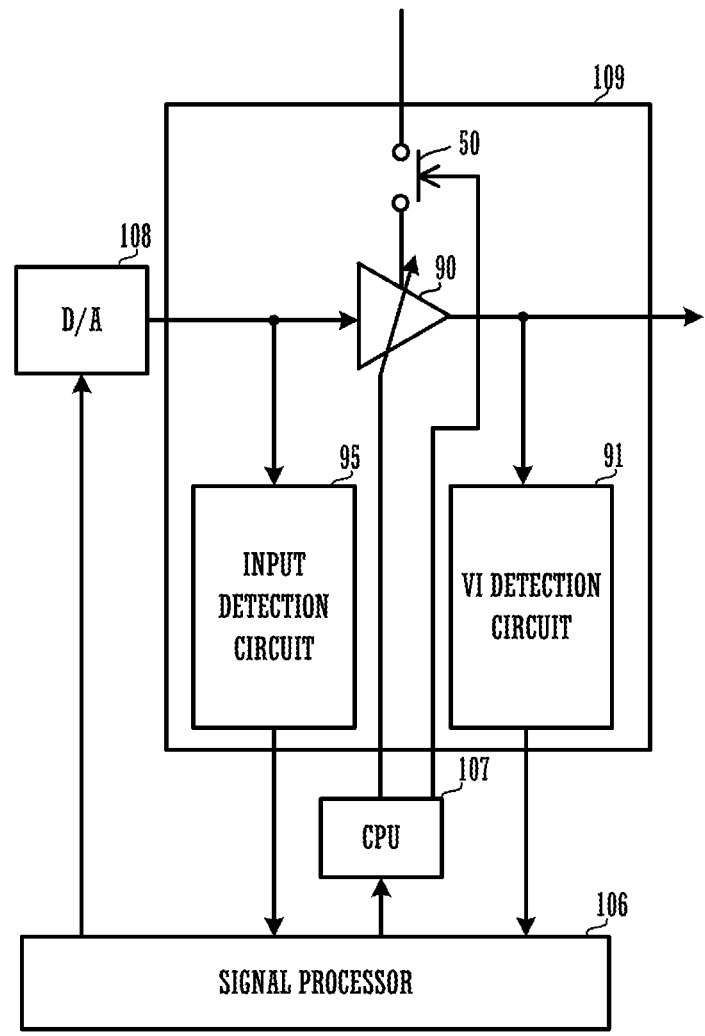
FIG. 18 is a block diagram showing a configuration of an amplifier 109 that shuts off a power source at the time of silence.

For example, FIG. 18 is a block diagram showing a configuration of the amplifier 109 that shuts off a power source at the time of silence, for reduction in power consumption. In FIG. 18, the amplifier 109 includes an amplifying element 90, a VI detection circuit 91, an input detection circuit 95, and a switch 50.

The input detection circuit 95 is connected to the preceding stage of the amplifying element 90, and detects the level of an audio signal to be inputted to the amplifying element 90. The CPU 107 determines whether or not an audio signal is inputted based on the detection result of the input detection circuit 95. For example, the CPU 107 determines that an audio signal is being inputted, in a case in which the level of the audio signal detected in the input detection circuit 95 is not less than a predetermined value. The CPU 107 determines that an audio signal is not being inputted, in a case in which the level of the audio signal is less than a predetermined value. The CPU 107, in a case of determining that an audio signal is not being inputted, turns off the switch 50 and shuts off the power source of the amplifying element 90. As a result, the CPU 107 reduces wasteful power consumption.

On the other hand, the CPU 107, even when turning off the switch 50, turns on the switch 50 in a case in which the voltage value detected in the VI detection circuit 91 exceeds a predetermined threshold value. When the power source of the amplifying element 90 is shut off, the cone of a speaker unit vibrates freely. Accordingly, the cone of the speaker unit may vibrate under the influence of a sound emitted from other speakers. When the cone of the speaker unit vibrates, there is a possibility that the amplifying element 90 may be damaged due to a counter electromotive force. In particular, in a case of a PA (Public Address) system in a large-scale space, a large number of a plurality of speakers are installed next to each other. In addition, the volume of each speaker becomes very large. Accordingly, vibration between the plurality of speakers significantly affects each other.

Thus, the CPU 107, even when shutting off the power source of the amplifying element 90, turns on the switch 50 and turns on a power source, in a case in which the voltage value detected in the VI detection circuit 91 exceeds a predetermined threshold value. When a power source is supplied to the amplifying element 90, an operation of the cone of a speaker unit is controlled by electric power (power of an output signal) of the power source. As a result, the amplifier 109 prevents the amplifying element 90 from being damaged due to the counter electromotive force generated when the cone of a speaker unit vibrates.

Then, as shown in FIG. 13, in a case in which an output value of each speaker is sent to the mixer 11, the counter electromotive force of each speaker is able to be monitored in the mixer 11. In such a case, the mixer 11 sends instructions to turn on a power source, to a speaker of which the counter electromotive force exceeds a predetermined value. In this manner, the output value of the amplifier is outputted to outside, which enables a user to monitor a state of each speaker from a server. The audio device is able to prevent a problem from occurring beforehand while reducing power consumption.

The invention claimed is:

1. An audio system comprising:
   a mixer including:
      a first processor; and
      a first network interface connectable to a network, through which an audio signal is output; and
   an audio device comprising:
      a second network interface connectable to the network to connect to the second network interface, through which the audio signal output from the mixer is received;
      a second processor configured to:
         obtain the audio signal from the second network interface;
         process the audio signal; and
         output the processed audio signal;
      an amplifier that amplifies the processed audio signal output by the second processor;
      a speaker unit connected to the amplifier; and
      a detection circuit that detects a current value and a voltage value output from the amplifier,
   wherein the second processor is further configured to:
      obtain the current value and the voltage value detected by the detection circuit; and
      send, via the second network interlace, the obtained current and voltage values to the mixer, and
   wherein the first processor is configured to:
      receive from the audio device, via the first network interface, the detected current and voltage values sent by the audio device;
      analyze frequency characteristics of impedance of the received current and voltage values for occurrence of a resonant frequency having a steep peak characteristic to predict a possibility of a problem occurring in the speaker unit; and
      change at least one parameter associated with the audio signal to be transmitted to the audio device in a case where an analysis result indicates that the frequency characteristics of impedance includes a steep peak characteristic.

2. The audio system according to claim 1, wherein the second processor is a signal processor that processes the audio signal received through the second network interface.

3. The audio system according to claim 1, wherein the audio device further comprises a power converter that supplies power to the amplifier.

4. The audio system according to claim 3, wherein the audio device further comprises a power supply that supplies alternating-current power to the power converter, which supplies direct-current power to the amplifier.

5. The audio system according to claim 1, wherein the second processor also analyzes the current and voltage values to predict a possibility of a problem occurring in the audio device.

6. A controlling method for an audio system including a mixer including a first network interface, and an audio device including a second network interface, a detection circuit, an amplifier, and a speaker connectable to the amplifier, the method comprising:
- outputting, via the first network interface connected to a network, an audio signal from the mixer;
- receiving, via the second network interface connected to the network, the audio signal from the mixer;
- processing the received audio signal and outputting the processed audio signal;
- amplifying, using the amplifier, the output processed audio signal;
- detecting, using the detection circuit, a current value and a voltage value output from the amplifier;
- obtaining the detected current value and the detected voltage value and sending, via the second network interface, the obtained detected current and voltage values to the mixer;
- receiving from the audio device, via the first network interlace, the detected current value and the voltage value;
- analyzing frequency characteristics of impedance of the received current and voltage values for occurrence of a resonant frequency having a steep peak characteristic to predict a possibility of a problem occurring in the speaker unit; and
- changing at least one parameter associated with the audio signal to be transmitted to the audio device in a case where an analysis result indicates that the frequency characteristics of impedance includes a steep peak characteristic.

7. The controlling method according to claim 6, wherein:
- the audio device includes a signal processor that processes the audio signal received through the second network interface, and
- the signal processor performs the obtaining of the current and voltage values and the sending of the obtained current and voltage values to the mixer.

8. The controlling method according to claim 6, wherein the audio device includes a power converter that supplies power to the amplifier.

9. The controlling method according to claim 8, wherein:
- the audio device further includes a power supply, and
- the power supply supplies alternating-current power to the power converter, which supplies direct-current power to the amplifier.

* * * * *